United States Patent [19]

Bennett

[11] Patent Number: 4,587,199

[45] Date of Patent: May 6, 1986

[54] CONTROLLED ROUGHENING OF A PHOTOSENSITIVE COMPOSITION

[75] Inventor: Allyn N. Bennett, Towanda, Pa.

[73] Assignee: E. I. Du Pont de Nemours and Company, Wilmington, Del.

[21] Appl. No.: 512,758

[22] Filed: Jul. 11, 1983

[51] Int. Cl.$^4$ .......................... G03C 1/90; G03C 1/60
[52] U.S. Cl. ..................................... 430/260; 430/258; 430/259; 430/950; 430/273; 430/22; 430/961; 430/523; 156/286
[58] Field of Search ............... 430/258, 259, 260, 950, 430/273, 22, 961, 523; 156/286

[56] References Cited

U.S. PATENT DOCUMENTS

| | | | |
|---|---|---|---|
| 3,305,416 | 2/1967 | Kahan et al. | 156/286 X |
| 3,469,982 | 9/1969 | Celeste | 430/256 |
| 3,891,443 | 6/1975 | Halpern et al. | 430/259 |
| 3,984,244 | 10/1976 | Collier et al. | 96/67 |
| 4,059,768 | 11/1977 | Van Landeghem et al. | 250/483 |
| 4,127,436 | 11/1978 | Friel | 427/96 X |
| 4,168,979 | 9/1979 | Okishi et al. | 96/75 |
| 4,229,518 | 10/1980 | Gray et al. | 430/273 |
| 4,238,560 | 12/1980 | Nakamura et al. | 430/162 |
| 4,252,879 | 2/1981 | Inoue et al. | 430/9 |
| 4,287,299 | 9/1981 | Himmelmann et al. | 430/537 |

FOREIGN PATENT DOCUMENTS 0019178 11/1980 European Pat. Off. ............ 430/950

OTHER PUBLICATIONS

21617, "Use of Monodisperse Matte to Improve Resistance of Photographic Film to Handling and Coating Defects" *Research Disclosure,* Apr. 1982, p. 109.
"Directions for Use for the Bekk's Apparatus for Determining the Smoothness and Air-Permeability of Paper with Automatic Electrical Time Indication, Type 31E", TMC Testing Machines Inc., four pages.
"Smoothness of Paper (Bekk Method)", T 479, SU-71 TAPPI, Dunwoody Park, Atlanta, Georgia, Suggested Method 1948, revised 1971, 2 pages.

*Primary Examiner*—John E. Kittle
*Assistant Examiner*—Cynthia Hamilton

[57] ABSTRACT

A photosensitive element containing a photosensitive composition sandwiched between a flexible support layer and a removable cover sheet, wherein the photosensitive composition has a roughened surface.

24 Claims, No Drawings

CONTROLLED ROUGHENING OF A PHOTOSENSITIVE COMPOSITION

BACKGROUND OF THE INVENTION

The present invention is directed to an improved photosensitive element with a photosensitive composition sandwiched between a flexible support layer and a removable cover sheet and a process of using such element. An alternate embodiment does not employ the cover sheet.

U.S. Pat. No. 3,469,982 discloses a negative acting photopolymerizable film resist in which a photopolymerizable layer is sandwiched between a temporary support film and a temporary cover film. This film has gained widespread usage in the manufacture of printed circuits in which the cover film is removed, the photopolymerizable layer is laminated by heat and pressure to a surface, e.g., copper, of a substrate to be permanently modified, the layer is imagewise exposed to actinic radiation, the film support is removed, the unexposed areas of the layer are removed by solvent washout (development), and the resultant bared area of the copper surface is permanently modified, such as by etching or deposition of metal.

The patent discloses solution coating of a photopolymerizable composition onto the support film, followed by drying and then lamination of the resultant dry layer to a surface such as a copper-clad printed circuit board to carry out the photoresist process. In commercial practice, however, the dried photopolymerizable layer, which must remain adhered to the support during storage and shipment, has been supplied as a sandwich between the support film and a cover sheet. This has enabled the sandwich element to be rolled up upon itself by the photoresist manufacturer and be supplied to the user, e.g., printed circuit manufacturer, as a compact, easy to handle roll. The cover film prevents the photopolymerizable layer from adhering to the backside of the support film during shipment and storage. In use, the cover film is stripped away and discarded, followed by the photoresist processing described above.

U.S. Pat. No. 4,193,797 discloses a similar photopolymerizable film resist with a photopolymerizable layer sandwiched between a temporary support film and a temporary cover film except the photopolymerizable composition is positive acting rather than negative acting.

U.S. Pat. No. 3,984,244 discloses a channelled photosensitive element with grooves of at least 0.0005 inches (0.00127 cm) and a process for its use as a photoresist on a surface having raised areas or discontinuities such as a circuit board surface having raised metallic circuit components. A photosensitive, thermoplastic layer is forced into contact with the surface having raised areas with little or no entrapment of air bubbles. When the photosensitive layer is forced into intimate contact, the air between the layer and surface escapes through the channels in the photosensitive layer and the layer deforms and envelops the raised areas of the surface.

The present invention is particularly adapted for use as a dry film solder mask to overcome any inability of the laminated photosensitive composition to conform to the raised circuitry of the substrate. The dry film can initially seal around portions of the ground planes or large insulating areas devoid of circuitry entrapping air between the substrate and the mask. Such entrapped air results in poor adhesion of mask to board, blistering of the mask during tinning and soldering procedures, and loss of circuit definition when the circuit itself consists of a low melting conductor such as solder. The present invention overcomes such air entrapment in the lamination step.

SUMMARY OF THE INVENTION

The present invention is directed to a photosensitive element and its process of use comprising a flexible support bearing at least one layer of a photosensitive composition and a removable cover sheet, said support having greater adhesion than the cover sheet to form the photosensitive element, whereby the improvement comprises the photosensitive composition having a roughened finish on its surface which faces toward the cover sheet and whereby the surface roughness of said photosensitive composition is in an average range of from 2 to 11 microns, peak to valley distance. An alternate embodiment of the photosensitive element does not employ a cover sheet.

DETAILED DESCRIPTION OF THE INVENTION

The types of photosensitive elements of the present invention are well known in the prior art and are of a sandwich structure with a photosensitive composition between a support layer and a cover sheet. This type of photosensitive element generally containing a photopolymerizable polymer has general commercial use as, e.g., resists and solder masks in manufacture of printed circuit boards.

The present invention differs over the prior art in the degree of roughness of the surface of the photosensitive composition which faces the cover sheet. Generally such photosensitive compositions have a smooth surface although U.S. Pat. No. 3,984,244 discloses a photosensitive composition with a plurality of channels of at least 0.0005 inches (0.00127 cm). In such patent vacuum lamination is not used.

In contrast in the present photosensitive element a limited degree of roughness is present in the surface of the photosensitive composition which faces the flexible cover sheet. In use of the photosensitive element as a solder mask the cover sheet is removed prior to vacuum lamination of the film supported photosensitive composition to a substitute having a raised relief due to circuitry in a printed circuit board. Such process of vacuum lamination is conventional in the prior art except for the presence of the roughened surface of the photosensitive composition. The roughened surface construction of the photosensitive composition follows air to be evacuated from areas between the photosensitive composition and the surface of the substrate with its raised relief. Uneven lamination with the result of air entrapment between the two surfaces is overcome since passageways are present to allow air evacuation.

The degree of roughness of the photosensitive composition lies between narrow limits particularly since undue roughness, i.e., deep channels such as disclosed in U.S. Pat. No. 3,984,244, lies outside the scope of the present invention. Also excluded are conventional smooth photosensitive composition surfaces which inherently have some nonuniformity in the surface. In the present disclosure "surface roughness in an average range" means the average of all peak to valley distances of all nonuniformities of a surface greater than 1 micron. In other words, any nonuniformity of 1 micron or less is not used in any calculation. Also in the present disclosure "roughened finish" is used in its normal context with a surface having a degree of roughness within the defined values. A roughened finish would not include, e.g., a surface with an occasional scratch. A minimum value for the surface roughness of the photosensitive composition is an average of 2 microns, peak to valley distance and more preferably the minimum average surface roughness is at least 4 microns. Generally an upper limit on surface roughness is 11 microns and more generally 10 microns. Preferably the surface is substantially free of any indentations greater than 11 microns since a greater degree of roughness can interfere with the lamination procedure or can introduce criticality into the flowability of the photosensitive composition under the lamination conditions.

Roughness increases adhesion between the surface of the photopolymer and the cover sheet. Illustratively with excessive roughness the lamination of the photosensitive composition can produce thinned areas of the photosensitive composition on the substrate. A preferred degree of roughness is in an average range of from 4 to 8 microns, peak to valley distance. Examples of suitable roughened surfaces of the photosensitive composition, and cover sheet if roughened, are textured, matte and embossed finishes.

An alternate way of describing surface roughness is by measurement of air bleed times using a Berk smoothness tester. The test procedure in the operating manual (incorporated by reference herein) is directly followed except the handle weight is not used. The time period is measured to obtain a vacuum drop (relative to atmospheric pressure) from a mercury level of 38 cm. to 36 cm. The "smoothness" of a specimen is expressed as the time required for passing 10 cm$^3$ of air, by an underpressure of 0.5 atm, between the specimen surface and an annular, polished surface of a glass disk with 10 cm$^2$ area, held together at a pressure of 0.38 kg/cm$^2$.

This test procedure is as follows:

Determining smoothness

1. Lock lever by means of bolt. Bring the entire apparatus into a horizontal position, as shown by the water level on lever.
2. Remove bolt and place it in its hole at the right side on the bed plate. Raise lever all the way by means of the grip on the cylindrical weight, mounted on the free end of lever. Remove the weight.
3. Place the small cylindrical plug, *with its smooth face up*, in the 1 cm$^2$ measuring central bore of the glass disk, the polished annular area of which measures 10 cm$^2$.
4. From the specimen to be tested, cut a square piece of 5×5 cm. This test piece should be free from creases, slivers and other defects. For future reference, mark the appropriate side.
5. Wipe the polished face of the glass disk once more with a shammy and apply the test piece, *with the to be determined side down*, symmetrically onto the polished face. Place the pressure disk with its layer of soft rubber of about 2.5 mm thickness, symmetrically on top of the test piece.
6. With one hand maintaining lever in its raised position, pull back catch with the other hand and then carefully lower lever, making sure that the lower end of adjusting screw bears as nearly centrally on pressure-disk.
7. Adjust screw until the water level on lever shows a horizontal position.
8. Before proceeding with the proper test, an interval of at least 1 minute has to elapse, in order to allow the test piece to settle under the load. During this interval, the under $C_9$ given operations can be carried out.
9. The left switch still stands at "OFF". Now turn the fourwaycock onto position "P" (Pumping), connecting thereby the air receiver to the suction pump. By means of this suction pump air is exhausted from the air receiver until the mercury column in stand pipe (reaches the glass safety valve).

This safety valve is only intended as a signal not to continue pumping. Care has to be taken, that no mercury can penetrate into the apparatus. Mercury affects the metal air pipes and valves, and puts the apparatus out of order.

10. Approximately 1 minute after loading the test piece, the right selection switch is set at "36", the left switch at "ON" and next the fourwaycock turned onto "M" (Measuring), The air receiver is now connected with the central bore of the glass disk.
11. Due to the suction existing in the air receiver ambient air will now penetrate between the test piece and the polished glass disk and the mercury will drop.

The measuring of the time starts, as soon as the mercury level passes the contact at point "38" (cm mercury column). At that moment the stop watch is branched electrically and starts running. As soon as the mercury level passes point "36" (cm mercury column) the electric current is disconnected and the chronometer stops. The correct time, accurate up to 1/5th of a second, can now be read from the chronometer.

The left switch is now set at "OFF", the fourwaycock turned onto "O" and the stop watch put back to zero by pushing the knob at the left side of the chronometer.

12. The drop of the mercury level from point "38" (cm mercury column) to point "36" (cm mercury column) corresponds to a penetration of 10 cm$^3$ of ambient air into the air receiver, having passed between the speciment surface to be tested and the similar, highly polished glass disk.

The "smoothness" of a specimen is expressed as the time required for passing 10 cm$^3$ of air, by an under pressure of 0.5 atm, between the specimen surface and an annular, polished surface of a glass disk with 10 cm$^2$ area, held together at a pressure of 0.38 kg/cm$^2$.

13. The proper test being finished, lever is raised all the way and pressure disk as well as the test piece, removed. In case the apparatus will not be used again, the polished glass disk has to be protected with the cover, furnished with the apparatus."

In accordance with this Bekk roughness test labelled herein as "Bekk roughness test", the roughness of a cover sheet is measured. The test procedure is not employed for the surface of the photosensitive material such as a photopolymer which follows the contours of the cover sheet since the softness of the material may interfere with the test results. The Bekk roughness test values should be in a range from 20 seconds to 40 minutes and preferably from 2 minutes to 7 minutes.

A preferred mode of obtaining the necessary degree of roughness of the surface of the photosensitive composition is with use of a roughened cover sheet. The photosensitive composition can have a direct imprint of the cover sheet. An alternate technique of forming surface roughness of the photosensitive composition is to employ a tool such as a brush. A cover sheet, although generally preferred, need not be employed and only a two piece construction, i.e., a support and a photosensitive polymer layer, can be used. A disadvantage of not using a cover sheet is that the composition is only protected to a limited degree, e.g., while in a roll form. Also additional consideration may be necessary in handling and storage of the photosensitive composition since flowability of the photosensitive thermoplastic material can eliminate its surface roughness.

In a preferred embodiment, the surface of the roughened cover sheet which faces away from the photosensitive layer also has its surface roughened. Generally during storage the photosensitive composition is formed into a roll. Soft photosensitive resists and solder masks in roll form may suffer from at least one of three major quality problems. First, air generally initially uniformly distributed in laps in the roll can slowly migrate into pockets or bubbles after a roll has been made due to localized stresses (external contact, thickness variations, tension variations, shrinkage variations). These bubbles induce a secondary flow in the soft photsensitive composition causing cosmetic and functional defects (thin spots). The reduced photsensitive composition thickness joepardizes functionality of the photosensitive layer.

Second, the contraction in the roll of the support or cover sheet, whichever has the highest tendency to shrink, can lead to the gradual formation of wrinkles in the composite structure. This wrinkling also may induce secondary flow resulting in local variations in the thickness of the photosensitive composition.

Third, polymerization of photopolymer can occur during storage in areas of hard bands or gauge variations in the product thickness which cause exclusion of air from the film laps in certain areas. With cover sheets of the invention, the continued presence of air due to the rough surface in these hard bands may have a strong inhibiting affect on this type of chemical instability.

The use of a second roughened finish on the cover sheet on its surface which does not face the photosensitive composition provides for a relatively easy movement and uniform distribution of the air between laps in a roll eliminating or reducing related secondary flow problems. The roughness may provide a uniform compressible cushioning effect that compensates for thickness variation in a photosensitive element. This cushioning can minimize the formation of soft spots in thin product areas, in turn reducing the tendency for the formation of wrinkles. In addition, this cushioning reduces defects in the thicker areas. Also the tendency of defects due to dirt or other high spots to propagate lap to lap can be reduced.

An additional advantage is the rough outside surface of the cover sheet which does not face the photosensitive composition maintains a supply of oxygen between laps even in the hard bands (high stress regions) of a roll. This oxygen can inhibit autopolymerization of sensitive photopolymers during storage. The modification can increase product shelf life while at the same time reduce the requirement for a heavy loading of inhibitor in the coating formulation which can have an adverse affect on end use sensitometry and performance.

The degree of roughness of the cover sheet surface which does not face the photosensitive composition may vary within wide limits. A critical feature is that a degree of roughness is present which allows air to be present when a photosensitive element is wound into a roll. Generally a surface roughness of an average of at least 2 microns, peak to valley distance, is suitable and more preferably an average of at least 4 microns. Generally an upper limit on surface roughness, peak to valley of up to 40 microns and more preferably up to 10 microns is suitable. It is understood that as the thickness of the cover sheet is increased, a greater degree of roughness is suitable, e.g., greater than 40 microns. The frequency of disparities required depends on Young's modulus and thickness of the cover sheet with fewer being required on higher modulus, thick cover sheets to have the same effect. As the surface roughness increases, a greater diameter will generally be obtained when a photosensitive element is wound in a roll. A disadvantage of greater storage area for an equal photosensitive composition is considered a small disadvantage in comparison to the advantage of the present invention. Greater yield such as in making printed circuit boards can be directly realized with the roughened cover sheet. Examples of suitable roughened surfaces are textured, matte and embossed finishes. Generally the roughness extends across the width of the roll, i.e., across the width of the photosensitive element.

The cover sheet must have less adhesion to the photosensitive composition in comparison to the support since the cover sheet is removed prior to lamination of the supported photosensitive composition to a substrate. Instead of the roughened cover sheet of the present invention if a roughened support is used, product performance cannot be maintained. Upon exposure to actinic radiation of the photosensitive composition through the support, light is scattered by the presence of the rough support surface and this scattering impairs photographic resolution and image quality. A roughened support surface roughness can impose a functional limitation on compactness of imageable lines and spaces in the manufacture of sophisticated circuit boards.

Suitable removable, protective cover sheets are well known in the art but without surface roughening. They preferably have a high degree of dimensional stability and may be chosen from a wide variety of sheet materials composed of high polymers, e.g., polyamides, polyolefins, polyesters, vinyl polymers, and cellulose esters, and may have a thickness of from 0.00025 inch ($\approx$0.0006 cm) to 0.008 inch ($\approx$0.02 cm) or more. A particularly suitable cover sheet is polyethylene of the thickness range above, preferably about 0.001 inch ($\approx$0.0025 cm) thick.

Suitable support materials, which are generally strippable and may be chosen from the same high polymers described above and may have the same wide range of thicknesses namely 0.00025 inch ($\approx$0.0006 cm) to 0.008 inch ($\approx$0.02 cm) or more. If exposure is to be made before removing the strippable support, it must, of course, transmit a substantial fraction of the actinic radiation incident upon it. If the strippable support is removed prior to exposure, no such restrictions apply. A particularly suitable support is a transparent polyethylene terephthalate film of the thickness range above and preferably about 0.001 inch ($\approx$0.0025 cm).

The photosensitive composition is generally present in a dry coating thickness of about 0.0003 inch ($\approx$0.0008 cm) to about 0.01 inch ($\approx$0.0025 cm). Thicker layers could also be used.

In practicing the invention, photosensitive film resist elements of various types may be used. In general photohardenable, negative-working elements are photopolymerizable elements of the type disclosed in U.S. Pat. No. 3,469,982 and the photocrosslinkable elements of the type disclosed in U.S. Pat. No. 3,526,504. Positive-working, resist elements may be of the photosolubilizable type, e.g., such as the o-quinone diazide elements of U.S. Pat. No. 3,837,860, or of the photodesensitizable type, e.g., such as the bisdiazonium salts of U.S. Pat. No. 3,778,270. Useful flame retardant solder mask compositions are disclosed in U.S. Pat. No. 4,278,752.

The photohardenable layer is prepared from polymeric components (binders), monomeric components, initiators and inhibitors such as in the patents referred to above.

Suitable binders which can be used as the sole binder or in combination with others include the following: polyacrylate and alpha-alkyl polyacrylate esters, e.g., polymethyl methacrylate and polyethyl methacrylate; polyvinyl esters, e.g., polyvinyl acetate, polyvinyl acetate/acrylate, polyvinyl acetate/methacrylate and hydrolyzed polyvinyl acetate; ethylene/vinyl acetate copolymers; polystyrene polymers and copolymers, e.g., with maleic anhydride and esters; vinylidene chloride copolymers, e.g., vinylidene chloride/acrylonitrile; vinylidene chloride/methacrylate and vinylidene chloride/vinyl acetate copolymers; polyvinyl chloride and copolymers, e.g., polyvinyl chloride/acetate; saturated and unsaturated polyurethanes; synthetic rubbers, e.g., butadiene/acrylonitrile, acrylonitrile/butadiene/styrene, methacrylate/acrylonitrile/butadiene/styrene copolymers, 2-chlorobutadiene-1,3 polymers, chlorinated rubber, and styrene/butadiene/styrene, styrene/isoprene/styrene block copolymers; high molecular weight polyethylene oxides of polyglycols having average molecular weights from about 4,000 to 1,000,000; epoxides, e.g., epoxides containing acrylate or methacrylate groups; copolyesters, e.g., those prepared from the reaction product of a polymethylene glycol of the formula $HO(CH_2)_nOH$, where n is a whole number 2 to 10 inclusive, and (1) hexahydroterephthalic, sebacic and terephthalic acids, (2) terephthalic, isophthalic and sebacic acids, (3) terephthalic and sebacic acids, (4) terephthalic and isophthalic acids, and (5) mixtures of copolyesters prepared from said glycols and (i) terephthalic, isophthalic and sebacic acids and (ii) terephthalic, isophthalic, sebacic and adipic acids; nylons or polyamides, e.g., N-methoxymethyl polyhexamethylene adipamide; cellulose esters, e.g., cellulose acetate, cellulose acetate succinate and cellulose acetate butyrate; cellulose ethers, e.g., methyl cellulose, ethyl cellulose and benzyl cellulose; polycarbonates; polyvinyl acetal, e.g., polyvinyl butyral, polyvinyl formal; polyformaldehydes.

The binder may contain sufficient acidic or other groups to render the composition processible in aqueous developer. Useful aqueous-processible binders include those disclosed in U.S. Pat. No. 3,458,311. Useful amphoteric polymers include interpolymers derived from N-alkylacrylamides or methacrylamides, acidic film-forming comonomer and an alkyl or hydroxyalkyl acrylate such as those disclosed in U.S. Pat. No. 3,927,199.

Suitable monomers which can be used as the sole monomer or in combination with others include the following: t-butyl acrylate, 1,5-pentanediol diacrylate, N,N-diethylaminoethyl acrylate, ethylene glycol diacrylate, 1,4-butanediol diacrylate, diethylene glycol diacrylate, hexamethylene glycol diacrylate, 1,3-propanediol diacrylate, decamethylene glycol diacrylate, decamethylene glycol dimethacrylate, 1,4-cyclohexanediol diacrylate, 2,2-dimethylolpropane diacrylate, glycerol diacrylate, tripropylene glycol diacrylate, glycerol triacrylate, trimethylolpropane triacrylate, pentaerythritol triacrylate, polyoxyethylated trimethylolpropane triacrylated and trimethacrylate and similar compounds as disclosed in U.S. Pat. No. 3,380,831, 2,2-di(p-hydroxyphenyl)-propane diacrylate, pentaerythritol tetraacrylate, 2,2-di-(p-hydroxyphenyl)-propane dimethacrylate, triethylene glycol diacrylate, polyoxyethyl-2,2-di-(p-hydroxyphenyl)-propane dimethacrylate, di-(3-methacryloxy-2-hydroxypropyl) ether of bisphenol-A, di-(2-methacryloxyethyl) ether of bisphenol-A, di-(3-acryloxy-2-hydroxypropyl) ether of bisphenol-A, di-(2-acryloxyethyl) ether of bisphenol-A, di-(3-methacryloxy-2-hydroxypropyl) ether of tetrachloro-bisphenol-A, di-(2-methacryloxyethyl) ether of tetrachloro-bisphenol-A, di-(3-methacryloxy-2-hydroxypropyl) ether of tetrabromo-bisphenol-A, di-(2-methacryloxyethyl) ether of tetrabromo-bisphenol-A, di-(3-methacryloxy-2-hydroxypropyl) ether of 1,4-butanediol, di-(3-methacryloxy-2-hydroxypropyl) ether of diphenolic acid, triethylene glycol dimethacrylate, polyoxypropyltrimethylol propane triacrylate (462), ethylene glycol dimethacrylate, butylene glycol dimethacrylate, 1,3-propanediol dimethacrylate, 1,2,4-butanetriol trimethacrylate, 2,2,4-trimethyl-1,3-pentanediol dimethacrylate, pentaerythritol trimethacrylate, 1-phenyl ethylene-1,2-dimethacrylate, pentaerythritol tetramethacrylate, trimethylol propane trimethacrylate, 1,5-pentanediol dimethacrylate, diallyl fumarate, styrene, 1,4-benzenediol dimethacrylate, 1,4-diisopropenyl benezene, and 1,3,5-triisopropenyl benzene.

In addition to the ethylenically unsaturated monomers mentioned above, the photohardenable layer can also contain at least one of the following free radical-initiated, chain-propagating, addition-polymerizable, ethylenically unsaturated compounds having a molecular weight of at least 300. Preferred monomers of this type are an alkylene or a polyalkylene glycol diacrylate prepared from an alkylene glycol of 2 to 15 carbons or a polyalkylene ether glycol of 1 to 10 ether linkages, and those disclosed in U.S. Pat. No. 2,927,022, e.g., those having a plurality of addition polymerizable ethylenic linkages particularly when present as terminal linkages. Especially preferred are those wherein at least one and preferably most of such linkages are conjugated with a double bonded carbon, including carbon double bonded to carbon and to such heteroatoms as nitrogen, oxygen and sulfur. Outstanding are such materials wherein the ethylenically unsaturated groups, especially the vinylidene groups, are conjugated with ester or amide structures.

Preferred free radical-generating addition polymerization initiators activatable by actinic light and thermally inactive at and below 185° C. include the substituted or unsubstituted polynuclear quinones which are compounds having two intracyclic carbon atoms in a conjugated carbocyclic ring system, e.g., 9,10-anthraquinone, 1-chloroanthraquinone, 2-chloroanthraquinone, 2-methylanthraquinone, 2-ethylanthraquinone, 2-tert-butylanthraquinone, octamethylanthraquinone, 1,4-naphthoquinone, 9,10-phenanthrenequinone, 1,2-benzanthraquinone, 2,3-benzanthraquinone, 2-methyl-1,4-naphthoquinone, 2,3-dichloronaphthoquinone, 1,4-dimethylanthraquinone, 2,3-dimethylanthraquinone, 2-phenylanthraquinone, 2-3-diphenylanthraquinone, sodium salt of anthraquinone alpha-sulfonic acid, 3-chloro-2-methylanthraquinone, retenequinone, 7,8,9,10-tetrahydronaphthacenequinone, and 1,2,3,4-tetrahydrobenz(a)anthracene-7,12-dione. Other photoinitiators which are also useful, even though some may be thermally active at temperatures as low as 85° C., are described in U.S. Pat. No. 2,760,863 and include vicinal ketaldonyl alcohols, such as benzoin, pivaloin, acyloin ethers, e.g., benzoin methyl and ethyl ethers; α-hydrocarbon-substituted aromatic acyloins, including α-methylbenzoin, α-allylbenzoin and α-phenylbenzoin. Photoreducible dyes and reducing agents disclosed in U.S. Pat. Nos. 2,850,445; 2,875,047; 3,097,096; 3,074,974; 3,097,097; and 3,145,104 as well as dyes of the phenazine, oxazine, and quinone classes; Michler's ketone, benzophenone, 2,4,5-triphenyl-imidazolyl dimers with hydrogen donors, and mixtures thereof as described in U.S. Pat. Nos.: 3,427,161; 3,479,185; and 3,549,367 can be used as initiators. Also useful with photoinitiators and photoinhibitors are sensitizers disclosed in U.S. Pat. No. 4,162,162.

Thermal polymerization inhibitors that can be used in photopolymerizable compositions are: p-methoxyphenol, hydroquinone, and alkyl and aryl-substituted hydroquinones and quinones, tert-butyl catechol, pyrogallol, copper resinate, naphthylamines, beta-naphthol, cuprous chloride, 2,6-di-tert-butyl-p-cresol, phenothiazine, pyridine, nitrobenzene and dinitrobenzene, p-toluquinone and chloranil. Also useful for thermal polymerization inhibition are the nitroso compositions disclosed in U.S. Pat. No. 4,168,982 and di-ethyl hydroxyl amines disclosed in U.S. Pat. No. 4,298,678.

Various dyes and pigments may be added to increase the visibility of the resist image. Any colorant used, however, should preferably be transparent to the actinic radiation used.

Generally, suitable substrates for the process of the invention involving printed circuit formation are those which have mechanical strength, chemical resistance and good dielectric properties. Thus, most board materials for printed circuits are thermosetting or thermoplastic resins usually combined with a reinforcing agent. Thermosetting resins with reinforcing fillers are ordinarily used for rigid boards, whereas thermoplastic resin without reinforcements are usually used for flexible circuit boards.

Typical board construction involves combinations such as phenolic or epoxy resins on paper or a paperglass composite, as well as polyester, epoxy, polyimide, polytetrafluoroethylene, or polystyrene on glass. In most instances, the board is clad with a thin layer of electroconductive metal of which copper is by far the most common.

DESCRIPTION OF SURFACE MEASURING TECHNIQUES

The technique involves viewing a cross section of the cover sheet with an Scanning Electron Microscope by freezing and fracturing the cover sheet. A cover sheet sample to be measured is cut into strips approximately 1 inch by 8 inches long. These strips are then notched near one end to control the fracture point. The notched end of the sample is immersed in liquid nitrogen to above the notch. After the sample is thoroughly frozen (2-5 minutes) the sample is removed and immediately given a quick snap by grabbing both ends, one in each hand, then moving both hands three inches closer together, then suddenly pulling them apart. The whole operation should be completed within 5 seconds of removing from nitrogen to assure a clean fracture. Samples are mounted with the edge vertical and sputtered with a conductive coating. These samples are then mounted in a Scanning Electron Microscope with measurements made at approximately 500× using a Robinson detector. The measurements are made by comparing the 10 micron reference line with the measurements on the photograph. The reference line in this case was 0.6 cm long. Measurements were made with this technique on matted polyethylene used in these experiments with the following results:

The peak height measured was 3 cm as measured from backside. This multiplied by the scale factor of 10 microns per 0.6 cm indicates a total peak height of 50 microns. The distance to the valley was determined to be 2.5 cm on the photographic × 10 microns per 0.6 cm showing that it is 41.6 microns; giving a difference in height from peak to valley of 8.4 microns. Other matted material was measured using this technique finding peak height of 2.8 cm × 10 microns per 0.6 cm = 46.7 microns. Valley height from the backside of the sheet of 2.4 cm × 10 microns per 0.6 cm = 40 microns with a difference of 6.7 microns.

Standard polyethylene which did not demonstrate these properties was also measured and found to have a peak height of 1.6 cm × a scale factor of 10 microns per 0.6 cm giving a peak height of 27.5 microns. With the valley being 1.6 cm × 10 microns per 0.6 cm with the valley being 26.7 microns giving a disparity height 0.8 microns.

In the following examples all parts and percentages are by weight unless otherwise indicated.

EXAMPLE 1

A photosensitive element was made from a support sheet of 0.92 mil of polyester, a photopolymer layer 3.1 mils thick and a matted polyethylene cover sheet with an average thickness of 1.15 mils and a roughness of 4 microns peak to valley, with the roughened side toward photopolymer. The photopolymer layer had the following composition by weight:

| | |
|---|---|
| Methylene chloride | 300.00 |
| Methanol | 30.00 |
| Pentaerythritol triacrylate | 15.00 |
| Trimethylolpropanetriacrylate | 15.00 |
| Hexamethoxymethylmelamine | 12.50 |
| Diethylhydroxylamine | 0.05 |
| Benzophenone | 4.00 |
| Michler's Ketone | 0.10 |
| 3-mercapto 1,2,4-triazole | 0.20 |
| Methylmethacrylate/ethyl acrylate/acrylic acid terpolymer (molecular weight 200,000 acid No. 80) | 42.15 |
| HVT-45 green pigment | 3.00 |
| polyvinylpyrrolidone | 6.00 |
| N—tertoctyl acrylamide/-methyl methacrylate/acrylic acid/hydroxypropylmethacrylate/t-butylamino ethyl methacrylate pentapolymer (molecular weight 50,000) | 2.00 |

The surface of the photopolymer layer in contact with the matted polyethylene cover surface had a roughened configuration since the photopolymer layer followed the configuration of the peaks and valleys of the cover sheet.

After removal of the cover sheet the supported photopolymer layer with is mirror image configuration of the matted cover sheet was laminated using a Du Pont SMVL Vacuum laminator over individual printed circuit boards having large planer areas and a circuit height of 2.5 to 4.1 mils. The circuit board and supported photopolymer layer were heated and air was evacuated from the chamber. The circuit board and supported photopolymer layer were heated by top and bottom platens which were at 95° C. While the circuit boards and supported photopolymer layer were heating, the chamber was evacuated to approximately 0.6 torr to remove air. Time required for this step was 45 seconds.

At the end of the heating and pumping period, atmospheric pressure was applied to the top platen causing the photopolymer to laminate to the panel. Time required for this step was 3 seconds.

The lamination procedure is the Du Pont SMVL Vacuum laminator involving a 60 second cycle with an exit board temperature of 152° F. (as measured with a pocket probe pyrometer NMP manufactured by Electronics Development Laboratory, Inc.).

These printed circuit boards were visually inspected and found to have no air entrapment between the boards and the laminated photopolymer layer.

EXAMPLE 2

A photosensitive element was made from a support which was 0.92 mils of polyester with 3.1 mils of the photopolymer of Example 1 and a cover sheet of matted polyethylene with an average thickness of 1.15 mils with a roughness of 2 microns, peak to valley distance with roughened side toward photopolymer.

This material was laminated following the procedure of Example 1 using Du Pont SMVL vacuum laminator over printed circuit boards (12"×15") having a circuit height of 2.5 to 4.1 mils, using a 60 second cycle with an exit board temperature of 152° F.

These boards were visually inspected and found to have 16 small areas showing small air entrapment near center of board.

EXAMPLE 3

A photosensitive element was made from a support sheet of 0.92 mils of polyester and a photopolymer layer 3.1 mils thick of the photopolymer of claim 1 and with standard cover sheet of 1.15 mil with a peak to valley roughness of 0.8 microns.

This material was laminated following the procedure of Example 1 using a Du Pont SMVL vacuum laminator over printed circuit boards having a circuit height of 2.5 to 4.1 mils using a 60 second cycle with an exit board temperature of 152° F.

These boards were visually inspected and found to have severe air entrapment over all large ground planes.

What is claimed is:

1. In a photosensitive element wound in a roll comprising a flexible support bearing at least one layer of a photopolymer composition and a removable cover sheet, said support having greater adhesion than the cover sheet to the photosensitive element and furthermore the support is strippable from the photopolymer composition or transmits actinic radiation, whereby the improvement comprises the cover sheet having a roughened finish on its surface which faces toward the photosensitive composition and whereby the photosensitive composition follows contours of the cover sheet whereby the surface roughness of the photosensitive composition is in an average range of from 2 microns to 11 microns, peak to valley distance.

2. The element of claim 1 wherein the cover sheet has a roughened finish on its surface which faces the photosensitive composition whereby the roughened finish of the photosensitive layer follows the contours of the cover sheet.

3. The element of claim 1 wherein said average range is at least 4 microns.

4. The element of claim 1 wherein the photosensitive composition with the roughened finish has a peak to valley average distance of 4 microns to 8 microns.

5. The element of claim 1 wherein the surface roughness is in an average range not greater than 8 microns.

6. The element of claim 1 with another roughened surface on the cover sheet or support whereby the roughened surface allows air to be present between layers in a roll of the photosensitive element.

7. The element of claim 6 wherein the cover sheet is roughened on both sides.

8. The element of claim 6 with a textured finish, a matte finish or an embossed finish.

9. The element of claim 1 wherein the roughened finish is substantially free of indentations greater than 11 microns.

10. In a photosensitive element wound in a roll comprising a flexible support bearing at least one layer of a photopolymer composition and a removable cover sheet, said support having greater adhesion than the cover sheet to the photosensitive element furthermore and the support is strippable from the photopolymer composition or transmits actinic radiation, whereby the improvement comprises the cover sheet having a roughened finish on its surface which faces toward the photosensitive composition and whereby the photosensitive composition follows contours of the cover sheet whereby the surface roughness of the photosensitive composition measured by Bekk roughness test is in a range from 20 seconds to 40 minutes.

11. The element of claim 10 wherein the surface roughness is in a range from 2 minutes to 7 minutes.

12. The element of claim 10 with another roughened surface on the cover sheet or support whereby the roughened surface allows air to be present between layers in a roll of the photosensitive element.

13. The element of claim 12 wherein the cover sheet is roughened on both sides.

14. The element of claim 12 with a textured finish, a matte finish or an embossed finish.

15. The element of claim 10 wherein the roughened finish is substantially free of indentations greater than 11 microns.

16. In process of laminating under a vacuum a film supported photosensitive element to a substrate having a raised relief surface whereby the improvement comprises the photosensitive element on its surface which is laminated to the substrate having a roughened finish with the surface roughness in an average range from 2 to 11 microns, peak to valley distance.

17. The process of claim 16 wherein the photosensitive sheet is photopolymerizable.

18. The process of claim 17 wherein the photosensitive element is wound in a roll and unwound prior to lamination.

19. The process of claim 18 wherein said roughened finish is substantially free of indentations greater than 11 microns.

20. The process of claim 19 wherein said roughened finish is substantially of indentations greater than 10 microns.

21. The process of claim 17 wherein the roughened finish has an average range of at least 4 microns.

22. The process of claim 21 wherein the roughened finish has an average of 4 microns to 8 microns.

23. The process of claim 17 wherein the roughened finish is a textured finsih, a matte finish or an embossed finish.

24. The element of claim 1 wherein the support is strippable and transmits actinic radiation.

* * * * *